(12) United States Patent
Rikitake et al.

(10) Patent No.: US 11,040,626 B2
(45) Date of Patent: Jun. 22, 2021

(54) AC ELECTRIC ROLLING STOCK CONTROLLER

(71) Applicant: Mitsubishi Electric Corporation, Tokyo (JP)

(72) Inventors: Jungo Rikitake, Tokyo (JP); Katsuya Nishikawa, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/966,912

(22) PCT Filed: Feb. 8, 2018

(86) PCT No.: PCT/JP2018/004481
§ 371 (c)(1),
(2) Date: Aug. 3, 2020

(87) PCT Pub. No.: WO2019/155588
PCT Pub. Date: Aug. 15, 2019

(65) Prior Publication Data
US 2021/0046825 A1    Feb. 18, 2021

(51) Int. Cl.
*B60L 9/16* (2006.01)
*H02M 5/42* (2006.01)
*H03K 5/24* (2006.01)
*H03K 5/00* (2006.01)

(52) U.S. Cl.
CPC .......... *B60L 9/16* (2013.01); *H02M 5/42* (2013.01); *H03K 5/24* (2013.01); *H03K 2005/00013* (2013.01)

(58) Field of Classification Search
None
See application file for complete search history.

(56) References Cited

U.S. PATENT DOCUMENTS

2013/0229120 A1* 9/2013 Choutov ............... H05B 45/10
315/186
2018/0034388 A1 2/2018 Kawai et al.

FOREIGN PATENT DOCUMENTS

JP   H08168101 A   6/1996
JP   2018015865 A  2/2018

OTHER PUBLICATIONS

Office Action dated Oct. 13, 2020, issued in Japanese Patent Application No. 2019570231, 5 pages including 3 pages of English translation.

(Continued)

*Primary Examiner* — Cassandra F Cox
(74) *Attorney, Agent, or Firm* — Buchanan Ingersoll & Rooney PC

(57) ABSTRACT

An AC electric rolling stock controller includes a comparator that compares an intermediate link voltage $V_{EFC}$ generated at a smoothing capacitor with a setting value A, a comparator that compares the intermediate link voltage $V_{EFC}$ with a setting value B less than the setting value A, and a delayer that delays an output of the comparator in a case in which the output of the comparator is significant. It is determined that the initial charging of the smoothing capacitor is complete in a case in which at least one of an output of the comparator and an output of the delayer is significant.

7 Claims, 7 Drawing Sheets

(56) References Cited

OTHER PUBLICATIONS

International Search Report (PCT/ISA/210) dated Apr. 24, 2018, by the Japan Patent Office as the International Searching Authority for International Application No. PCT/JP2018/004481.

* cited by examiner

AC ELECTRIC ROLLING STOCK CONTROLLER

FIELD

The present invention relates to an alternating current (AC) electric rolling stock controller that receives AC power from an AC trolley for running.

BACKGROUND

An AC electric rolling stock controller includes a converter, a smoothing capacitor, and an inverter. AC power supplied from an AC trolley is converted into direct current (DC) power in the converter, and the DC power obtained by the conversion is then charged in the smoothing capacitor. The AC electric rolling stock controller determines that charging of the smoothing capacitor is complete when the charging voltage of the smoothing capacitor reaches a start-up voltage. The start-up voltage is a threshold voltage for determining completion of initial charging. Upon completion of the initial charging, the inverter starts to operate, thereby causing the motor of the AC electric rolling stock to be driven. Starting of rotation of a motor of an AC electric rolling stock is hereinafter referred to as start-up.

Patent Literature 1 listed below discloses, as a conventional technology, a technology that, during initial charging of a smoothing capacitor, monitors the charging voltage of the smoothing capacitor, and adjusts the charging voltage of the smoothing capacitor in response to variation in the trolley voltage, which is the voltage of the AC trolley, even after the charging voltage of the smoothing capacitor reaches the start-up voltage, thus to perform the initial charging taking into consideration a variation in the trolley voltage.

Patent Literature 1 describes that control of the differential voltage between the trolley voltage and the charging voltage of the smoothing capacitor at a constant level enables an inrush current to be suppressed, and overcharging to be prevented, even at a high trolley voltage.

CITATION LIST

Patent Literature

Patent Literature 1: Japanese Patent Application Laid-open No. H08-168101

SUMMARY

Technical Problem

In the technology of Patent Literature 1 listed above, no consideration is given to waveform distortion of the trolley voltage. This presents a problem in that distortion of the waveform of the trolley voltage leads to a longer charging time of the smoothing capacitor than when the waveform is not distorted, thereby causing a delay of completion time of the initial charging.

In addition, in the technology of Patent Literature 1 listed above, an increase in the trolley voltage will cause the charging voltage of the smoothing capacitor to be adjusted to a higher voltage depending on the increased value of the trolley voltage. This means that the start-up voltage for determination of completion of the initial charging is reset to a higher voltage during the initial charging. In this case, concern will arise that if the start-up voltage that has been reset is not suitably set for the amount of the waveform distortion of the trolley voltage, the charging voltage of the smoothing capacitor will be impeded from reaching the start-up voltage, and the initial charging will thus not be complete.

The present invention has been made in view of the foregoing, and it is an object of the present invention to provide an AC electric rolling stock controller capable of quickly and reliably starting up the AC electric rolling stock even when the waveform of the trolley voltage is distorted.

Solution to Problem

To solve the problem and achieve the object described above, the present invention is directed to an alternating current (AC) electric rolling stock controller disposed in an AC electric rolling stock. The AC rolling stock includes a converter that converts an AC voltage supplied from an AC trolley into a direct current (DC) voltage, and a smoothing capacitor that smoothens the DC voltage output from the converter to control initial charging of the smoothing capacitor. The AC electric rolling stock controller includes: a first comparator that compares an intermediate link voltage, which is a voltage generated at the smoothing capacitor, with a first threshold; a second comparator that compares the intermediate link voltage with a second threshold less than the first threshold; and a delayer that delays an output of the second comparator. It is determined that the initial charging of the smoothing capacitor is complete in a case in which at least one of an output of the first comparator and an output of the delayer is significant.

Advantageous Effects of Invention

An AC electric rolling stock controller according to the present invention provides an advantage in being capable of quickly and reliably starting up an AC electric rolling stock even when the waveform of the trolley voltage is distorted.

DESCRIPTION OF EMBODIMENTS

An AC electric rolling stock controller according to embodiments of the present invention will be described in detail below with reference to the drawings. Note that the following embodiments are not intended to limit the scope of the present invention. In addition, in the following embodiments, electrical connection and physical connection are not distinguished from each other, and are referred to simply as "connection".

First Embodiment

Figure 1:
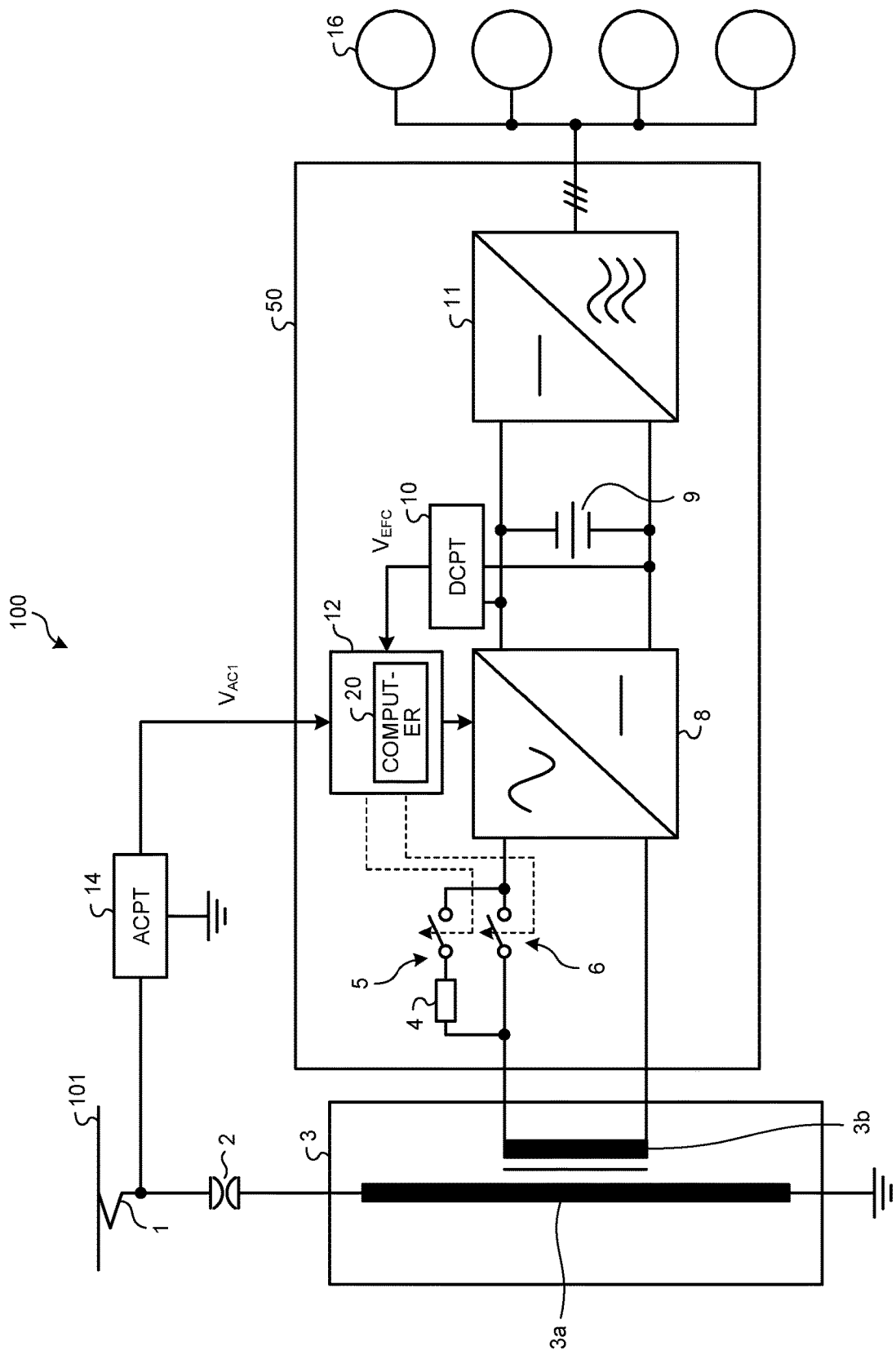
FIG. 1 is a configuration diagram of a drive system of an AC electric rolling stock including an AC electric rolling stock controller according to a first embodiment.

FIG. 1 is a configuration diagram of a drive system 100 of an AC electric rolling stock including an AC electric rolling stock controller 50 according to a first embodiment. As illustrated in FIG. 1, the drive system 100 of an AC electric rolling stock, according to the first embodiment, includes a pantograph 1, a circuit breaker 2, a main transformer 3, the controller 50, motors 16, and an AC voltage detector 14. The AC voltage detector 14 is hereinafter referred to as "RCPT 14".

In FIG. 1, the pantograph 1 receives AC power from an AC trolley 101. The main transformer 3 has a primary winding 3a that receives the AC power supplied through the pantograph 1. An AC voltage generated at a secondary winding 3b of the main transformer 3 is applied to the AC electric rolling stock controller 50. A circuit breaker 2 is disposed between the pantograph 1 and the main transformer 3. The circuit breaker 2 is a device disposed on the power cable connecting together the pantograph 1 and the main transformer 3, and is capable of interrupting current flowing between the pantograph 1 and the main transformer 3. An example of the circuit breaker 2 is a vacuum circuit breaker (VCB). The motors 16 are targets to be controlled by the controller 50, and are each an AC motor that drives an axle (not illustrated) of the AC electric rolling stock. The ACPT 14 detects an instantaneous value of the trolley voltage output by the AC trolley 101. In FIG. 1, the value detected by the ACPT 14 is denoted by "$V_{AC1}$". The detected value of the instantaneous value of the trolley voltage is hereinafter referred to as "trolley voltage instantaneous value $V_{AC1}$". The trolley voltage instantaneous value $V_{AC1}$ detected by the ACPT 14 is input to a controller 12 which will be described later.

A configuration and functionality of the controller 50 will next be described. The controller 50 includes, as illustrated in FIG. 1, a charging resistor 4, a charging contactor 5, a main contactor 6, a converter 8, a smoothing capacitor 9, a DC voltage detector 10, an inverter 11, and the controller 12. The controller 12 includes a computer 20. The DC voltage detector 10 is hereinafter referred to as "DCPT 10".

The charging contactor 5 and the main contactor 6 are connected in parallel with each other between the main transformer 3 and the converter 8, and are inserted in the charging path of the smoothing capacitor 9. Opening-closing control of each of the charging contactor 5 and the main contactor 6 is provided by the controller 12. The charging contactor 5 is a contactor closed during initial charging of the smoothing capacitor 9, and opened after completion of the initial charging. The main contactor 6 is a contactor opened during the initial charging of the smoothing capacitor 9, and closed after completion of the initial charging. The charging resistor 4 is connected in series with the charging contactor 5.

The converter 8 is a PWM converter. The AC voltage generated at the secondary winding 3b of the main transformer 3 is applied to the converter 8. The converter 8 converts the applied AC voltage into a DC voltage. The smoothing capacitor 9 smoothens the DC voltage output by the converter 8. The smoothed DC voltage is maintained on the smoothing capacitor 9. The inverter 11 converts the DC voltage maintained on the smoothing capacitor 9 into an AC voltage. The AC voltage obtained by conversion is applied to the motors 16 to drive the motors 16.

The DCPT 10 detects the voltage across the smoothing capacitor 9. In FIG. 1, the value detected by the DCPT 10 is denoted by "$V_{EFC}$". Note that, considering the position of the smoothing capacitor 9 between the converter 8 and the inverter 11, the voltage generated at the smoothing capacitor 9 may sometimes be referred to as intermediate link voltage. Thus, the detected value of the voltage across the smoothing capacitor 9 is hereinafter referred to as "intermediate link voltage $V_{EFC}$". The intermediate link voltage $V_{EFC}$ detected by the DCPT 10 is input to the controller 12.

An operation of the drive system 100 of an AC electric rolling stock to charge the smoothing capacitor 9 will next be described with reference to FIG. 1.

The AC voltage received from the AC trolley 101 is applied to the primary winding 3a of the main transformer 3 through the pantograph 1. The AC voltage applied to the primary winding 3a of the main transformer 3 is stepped down by the main transformer 3, and the AC voltage stepped down is output from the secondary winding 3b. Upon start-up of the AC electric rolling stock, the charging contactor 5 is closed first. In this situation, the main contactor 6 is in an open state. This causes the smoothing capacitor 9 to be charged through the charging resistor 4 and through the charging contactor 5.

During the initial charging of the smoothing capacitor 9, a switching device (not illustrated) provided in the converter 8 has not performed switching operation. Thus, a charging current to charge the smoothing capacitor 9 flows through a diode (not illustrated) provided in the converter 8. That is, during the initial charging of the smoothing capacitor 9, the converter 8 operates as a diode converter that provides rectification.

Upon completion of the initial charging, the main contactor 6 is closed, and the charging contactor 5 is opened. The charging contactor 5 is opened after closing of the main contactor 6. The inverter 11 starts to operate, and the AC electric rolling stock is started. The controller 12 monitors the intermediate link voltage $V_{EFC}$, and controls the converter 8 such that an amount of power to drive the motors 16 is constantly maintained in the smoothing capacitor 9. In this situation, the switching device (not illustrated) provided in the converter 8 is controlled using pulse width modulation (PWM) control by the controller 12. That is, in charging control of the smoothing capacitor 9 after the initial charging, the converter 8 operates as a switching converter.

Figure 2:
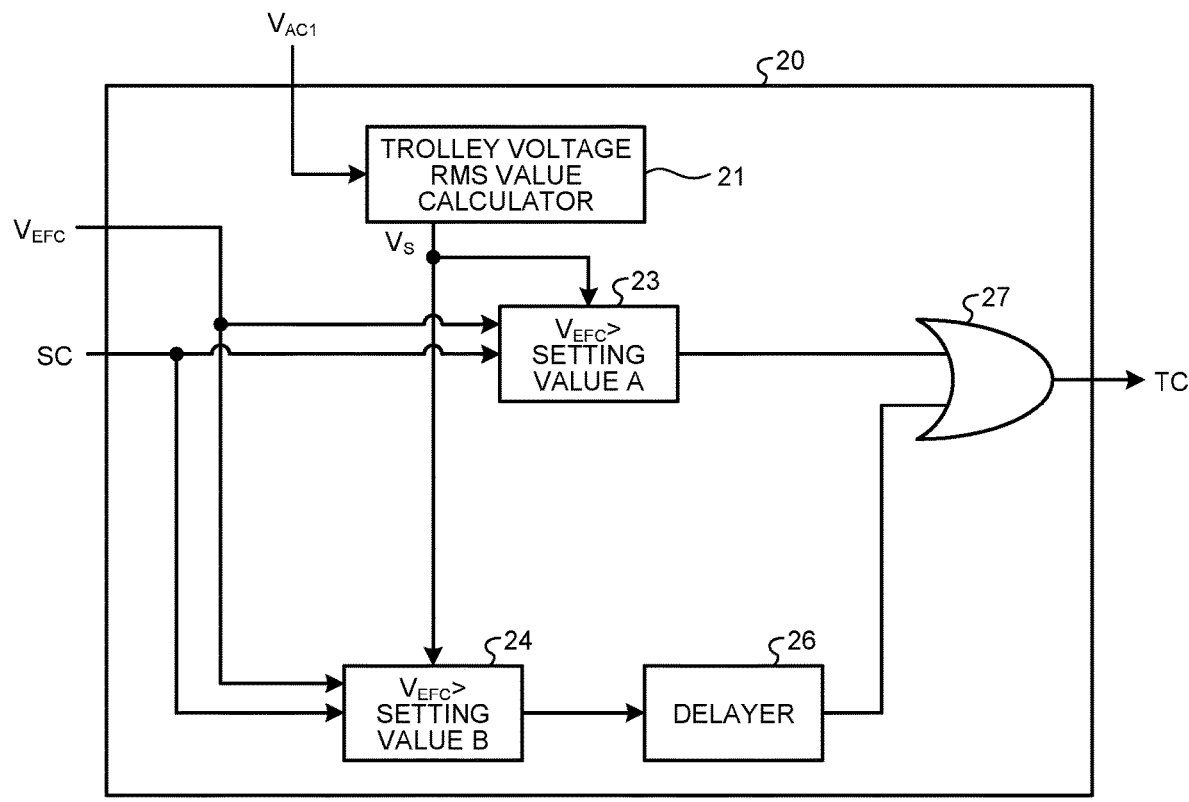
FIG. 2 is a block diagram illustrating a configuration of the computer in the first embodiment.
Figure 3:
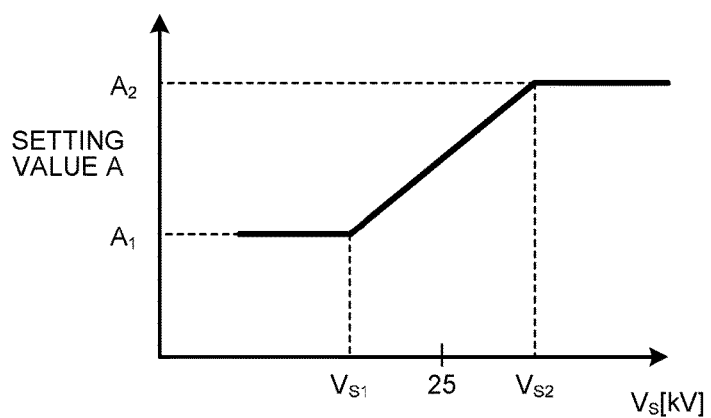
FIG. 3 is a diagram illustrating an example for a method of determining a setting value A in the first embodiment.

The computer 20 provided in the controller 12 will next be described with reference to FIGS. 2 and 3. FIG. 2 is a block diagram illustrating a configuration of the computer 20 in the first embodiment. FIG. 3 is a diagram illustrating an example for a method of determining a setting value A in the first embodiment.

The computer 20 includes a trolley voltage root mean square (RMS) value calculator 21, comparators 23 and 24, a delayer 26, and an OR circuit 27.

The trolley voltage RMS (root mean squared) value calculator 21 receives the trolley voltage instantaneous value $V_{AC1}$ detected by the ACPT 14. The trolley voltage RMS value calculator 21 calculates a trolley voltage RMS value $V_S$ using the trolley voltage instantaneous value $V_{AC1}$. The trolley voltage RMS value $V_S$ is an RMS value of the trolley voltage output from the AC trolley 101.

The comparator 23 receives the trolley voltage RMS value $V_S$ calculated by the trolley voltage RMS value calculator 21, the intermediate link voltage $V_{EFC}$ detected by the DCPT 10, and a start-up command SC. The start-up command SC is a signal to command starting up of the AC electric rolling stock. The start-up command SC is output from a cab (not illustrated), an operation management device (not illustrated) disposed on the AC electric rolling stock, or the like.

The comparator 23 compares the intermediate link voltage $V_{EFC}$ with a determination threshold, i.e., a setting value A. That is, the comparator 23 makes a comparison on magnitude relationship between the intermediate link voltage $V_{EFC}$ and the setting value A. In a case in which the intermediate link voltage $V_{EFC}$ is greater than the setting value A, the comparator 23 determines that the comparison result of the comparator 23 is significant, and outputs a logical "1" to the OR circuit 27. Otherwise, in a case in which the intermediate link voltage $V_{EFC}$ is less than or equal to the setting value A, the comparator 23 determines that the comparison result of the comparator 23 is not significant, and outputs a logical "0" to the OR circuit 27.

Although the foregoing description describes that a logical "1" is output to the OR circuit 27 in a case in which the intermediate link voltage $V_{EFC}$ is greater than the setting value A, a logical "1" may also be output to the OR circuit 27 in a case in a which the intermediate link voltage $V_{EFC}$ is equal to the setting value A. That is, a logical "1" may be output to the OR circuit 27 in a case in which the intermediate link voltage $V_{EFC}$ is greater than or equal to the setting value A.

The setting value A is calculated from the trolley voltage RMS value $V_S$. FIG. 3 illustrates an example of a method of determining the setting value A for an AC trolley having a nominal voltage of 25 kV. The horizontal axis of FIG. 3 represents the trolley voltage RMS value $V_S$, and the vertical axis of FIG. 3 represents the setting value A. The voltage on the AC trolley having a nominal voltage of 25 [kV] varies up to plus or minus approximately a dozen percent depending on the load condition. Accordingly, the example of FIG. 3 assumes that the amount of increase is proportional to the trolley voltage RMS value $V_S$ when the trolley voltage RMS value $V_S$ is greater than $V_{S1}$ [kV] and less than $V_{S2}$ [kV]. In addition, when the trolley voltage RMS value $V_S$ is less than or equal to $V_{S1}$ [kV], the setting value A is determined to be $A_1$; and when the trolley voltage RMS value $V_S$ is greater than or equal to $V_{S2}$ [kV], the setting value A is determined to be $A_2$. Note that $A_1$ and $A_2$ satisfy a relationship of $A_1<A_2$.

Returning to FIG. 2, the comparator 24 receives the trolley voltage RMS value $V_S$, the intermediate link voltage $V_{EFC}$, and the start-up command SC. The comparator 24 compares the intermediate link voltage $V_{EFC}$ with a determination threshold, i.e., a setting value B. That is, the comparator 24 makes a comparison on magnitude relationship between the intermediate link voltage $V_{EFC}$ and the setting value B. In a case in which the intermediate link voltage $V_{EFC}$ is greater than the setting value B, the comparator 24 determines that the comparison result of the comparator 24 is significant, and outputs a logical "1" to the delayer 26. The delayer 26 is a controller having a delay time element to delay an input signal for a certain time period and then output the signal. The delayer 26 does not immediately output the signal even when a logical "1" is input, but outputs the logical "1" to the OR circuit 27 with a delay of a certain time period. Otherwise, in a case in which the intermediate link voltage $V_{EFC}$ is less than or equal to the setting value B, the comparator 24 determines that the comparison result of the comparator 24 is not significant, and inhibits outputting of a logical "1".

Note that although the foregoing description describes that a logical "1" is output to the delayer 26 in a case in which the intermediate link voltage $V_{EFC}$ is greater than the setting value B, a logical "1" may also be output to the delayer 26 in a case in which the intermediate link voltage $V_{EFC}$ is equal to the setting value B. That is, a logical "1" may be output to the delayer 26 in a case in which the intermediate link voltage $V_{EFC}$ is greater than or equal to the setting value B.

In addition, although the foregoing description describes that the comparator 24 outputs a logical "1" in a case in which the intermediate link voltage $V_{EFC}$ is greater than the setting value B, the output signal does not necessarily need to be a logical "1". Any signal format may be used as long as the delayer 26 can recognize that "the intermediate link voltage $V_{EFC}$ is greater than the setting value B".

The setting value B is calculated from the trolley voltage RMS value $V_S$. The setting value A and the setting value B satisfy a relationship of A>B. The setting value B may be a fixed value, or may be a value varied depending on the setting value A. The advantage of use of the setting value B will be described later.

As described above, the OR circuit 27 receives the output of the comparator 23 and the output of the delayer 26. In a case in which at least one of the output of the comparator 23 and the output of the delayer 26 is a logical "1", the OR circuit 27 outputs a signal TC, which indicates completion of the initial charging of the smoothing capacitor 9. The signal TC is hereinafter referred to as "initial charging completion signal TC". When the OR circuit 27 outputs the initial charging completion signal TC, the controller 12 provides the opening-closing control described above on the charging contactor 5 and on the main contactor 6.

Figure 4:
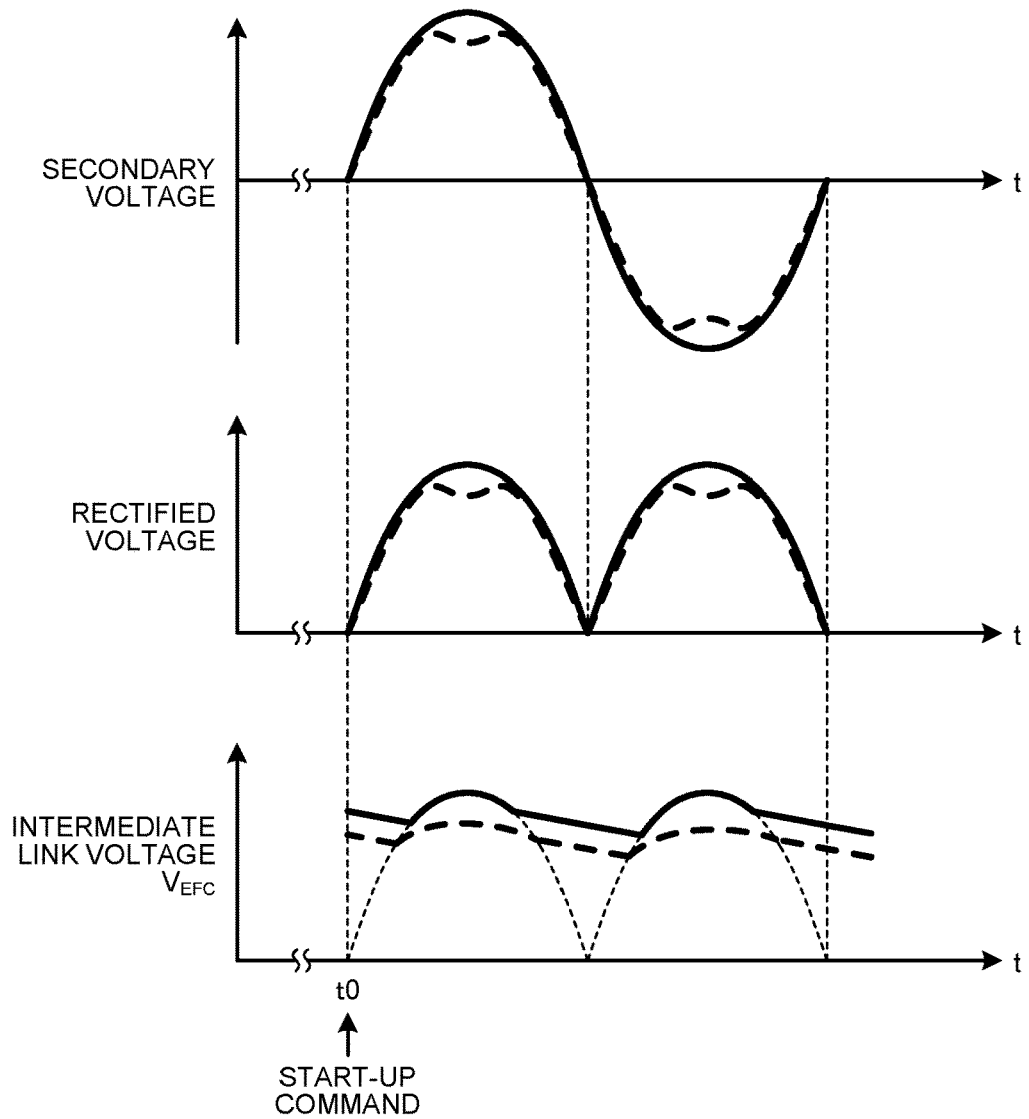
FIG. 4 is a diagram illustrating behaviors of a secondary voltage, of a rectified voltage, and of the intermediate link voltage $V_{EFC}$ in the drive system of FIG. 1.

FIG. 4 is a diagram illustrating behaviors of each voltage in the drive system 100 of FIG. 1. The top portion, the middle portion, and the bottom portion of FIG. 4 respectively illustrate time-varying waveforms of a secondary voltage, of a rectified voltage, and of the intermediate link voltage $V_{EFC}$ in a case in which the start-up command is input at time to.

The secondary voltage illustrated in the top portion of FIG. 4 represents the waveform of the AC voltage generated at the secondary winding 3b of the main transformer 3. The rectified voltage illustrated in the middle portion of FIG. 4 represents the waveform of the rectified voltage, which is the output voltage of the converter 8 when the converter 8 operates as a diode converter. The term of rectified voltage means that the smoothing capacitor 9 is not connected to the output side of the converter 8. In contrast, the intermediate link voltage $V_{EFC}$ illustrated in the bottom portion of FIG. 4 represents the waveform when the smoothing capacitor 9 is connected to the output side of the converter 8. When the smoothing capacitor 9 is connected to the output side of the converter 8, the output voltage of the converter 8 has a smoothed waveform such as one illustrated in the bottom portion of FIG. 4.

In the waveform in each of the top portion, the middle portion, and the bottom portion of FIG. 4, the bold solid line represents the waveform for an undistorted trolley voltage, while the bold broken line represents the waveform for a distorted trolley voltage. Moreover, the bottom portion of FIG. 4 illustrates, using the bold solid Fline, the waveform of the bold solid line in the middle portion of FIG. 4, i.e., the waveform of the rectified voltage for an undistorted trolley voltage.

When the waveform of the trolley voltage is distorted to drop around the peak value of the trolley voltage as illustrated by the broken line in the top portion of FIG. 4, the intermediate link voltage $V_{EFC}$ is reduced, as illustrated by the broken line in the bottom portion of FIG. 4, as compared to when the waveform of the trolley voltage is not distorted.

Figure 5:
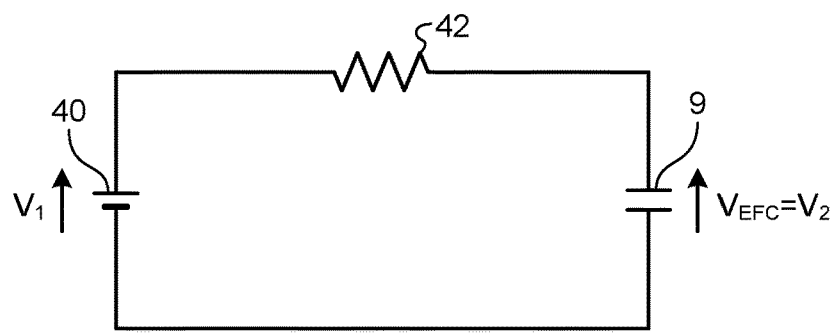
FIG. 5 is a first diagram for describing an inrush current in the AC electric rolling stock controller of the first embodiment.
Figure 6:
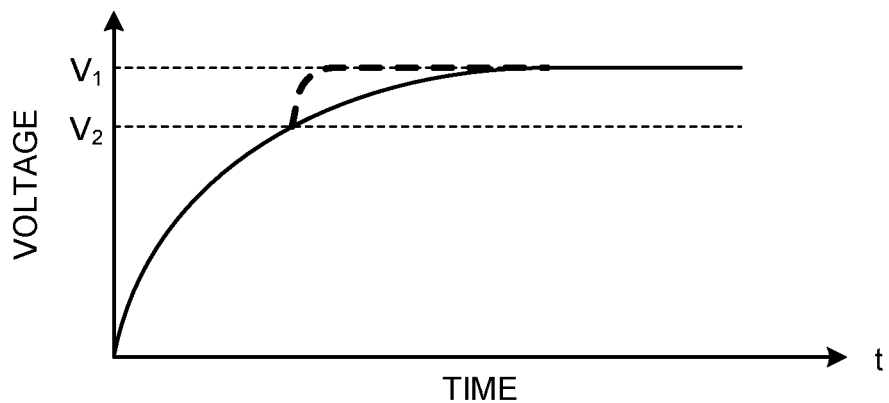
FIG. 6 is a second diagram for describing an inrush current in the AC electric rolling stock controller of the first embodiment.

FIG. 5 is a first diagram for describing an inrush current in the AC electric rolling stock controller 50 of the first embodiment. FIG. 6 is a second diagram for describing an inrush current in the AC electric rolling stock controller 50 of the first embodiment.

As described above, when the waveform of the trolley voltage is distorted to drop around the peak value, the intermediate link voltage $V_{EFC}$ is reduced as compared to when the trolley voltage is not distorted. An equivalent circuit of the charging circuit during charging of the smoothing capacitor 9 can be illustrated in a simplified manner as FIG. 5, where "$V_2$" denotes the intermediate link voltage $V_{EFC}$, i.e., the charging voltage of the smoothing capacitor 9, in this situation, and "$V_1$" denotes the RMS value of the rectified voltage output from the converter 8. In FIG. 5, the voltage $V_2$ of a DC power supply 40 corresponds to the RMS value of the rectified voltage, and the charging voltage $V_2$ of the smoothing capacitor 9 corresponds to the intermediate link voltage $V_{EFC}$. Then, the circuit is formed by the DC power supply 40 and the smoothing capacitor 9 connected to each other via an equivalent resistance 42 in the charging circuit. A greater differential voltage between the voltage $V_2$ and the charging voltage $V_2$ results in a more rapid change in the voltage immediately after the voltage $V_2$ is applied as illustrated in FIG. 6. In addition, the equivalent resistance 42 in the charging circuit is very low, thereby causing a high inrush current to flow through the smoothing capacitor 9.

Figure 7:
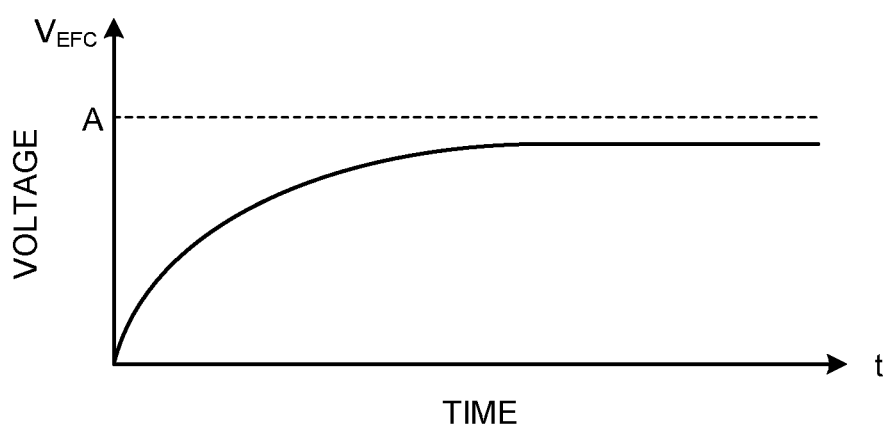
FIG. 7 is a first diagram for describing the reason for including the comparator 24 in the computer of the first embodiment.
Figure 8:
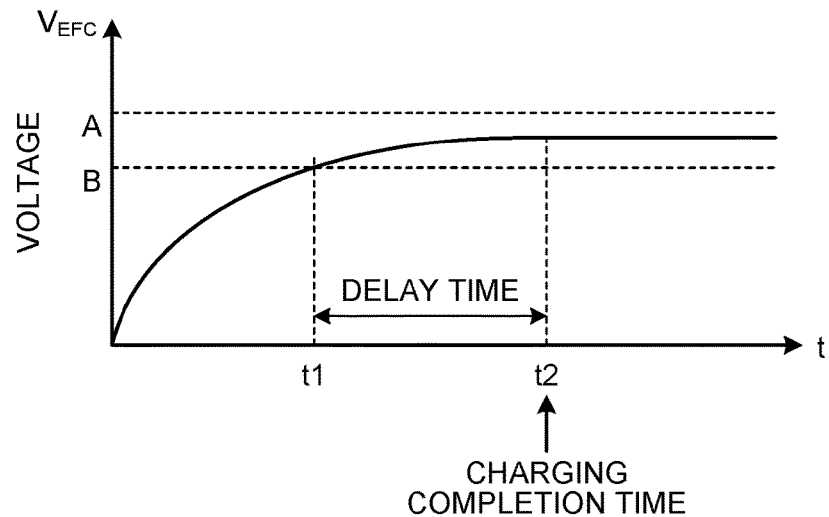
FIG. 8 is a second diagram for describing the reason for including the comparator 24 in the computer of the first embodiment.

FIG. 7 is a first diagram for describing the reason for including the comparator 24 in the computer 20 of the first embodiment. FIG. 8 is a second diagram for describing the reason for including the comparator 24 in the computer 20 of the first embodiment.

In a case in which the waveform of the trolley voltage is distorted, the value of the intermediate link voltage $V_{EFC}$ may never reach the setting value A depending on the setting value A as illustrated in FIG. 7. On the other hand, in view of the problem of an inrush current described above, the setting value A needs to be set to avoid a great differential voltage between $V_1$ and $V_2$, thereby hindering use of an extremely low value for the setting value. Thus, in the first embodiment, the concept of the setting value A of suppressing an inrush current is left unchanged, and instead, the comparator 24, which uses the setting value B having a concept different from the concept of the setting value A, is included.

FIG. 8 illustrates the waveform of the intermediate link voltage $V_{EFC}$ that is the same as that illustrated in FIG. 7. The setting value A is also at the same value. In addition, FIG. 8 illustrates a situation in which the intermediate link voltage $V_{EFC}$ reaches the setting value B at time t1, and charging is complete at time t2. The difference between time t2 and time t1 is a delay time that is set by the delayer 26.

To address the problem of distortion of the waveform of the trolley voltage described above, the setting value B is set to a value that ensures a reliable determination on completion of charging even when the waveform of the trolley voltage is distorted. As described above, the setting value A and the setting value B satisfy a relationship of A>B. Meanwhile, simply using the setting value B satisfying such relationship may cause the problem of an inrush current described above. However, the configuration of the first embodiment causes the determination on completion of charging to be suspended for a delay time by the action of the delayer 26 even when the intermediate link voltage $V_{EFC}$ has reached the setting value B. As illustrated in FIGS. 7 and 8, the waveform of the intermediate link voltage $V_{EFC}$ becomes a waveform that rises with the time constant of the charging circuit. Thus, making a determination of the setting value B in consideration of distortion of the waveform of the trolley voltage first, and then a determination of the delay time of the delayer 26 for the setting value B determined, based on an accepted value of inrush current enables the intermediate link voltage $V_{EFC}$ to reliably reach the start-up voltage while suppressing an inrush current.

As described above, the AC electric rolling stock controller according to the first embodiment determines that initial charging of the capacitor is complete when the result of the comparison between the intermediate link voltage and the setting value A is significant, or when the delayed output of the result of the comparison between the intermediate link voltage and the setting value B is significant. This enables the intermediate link voltage $V_{EFC}$ to reliably reach the start-up voltage while suppressing an inrush current into the smoothing capacitor. This enables the AC electric rolling stock to quickly and reliably start up even when the waveform of the trolley voltage is distorted.

Second Embodiment

Figure 9:
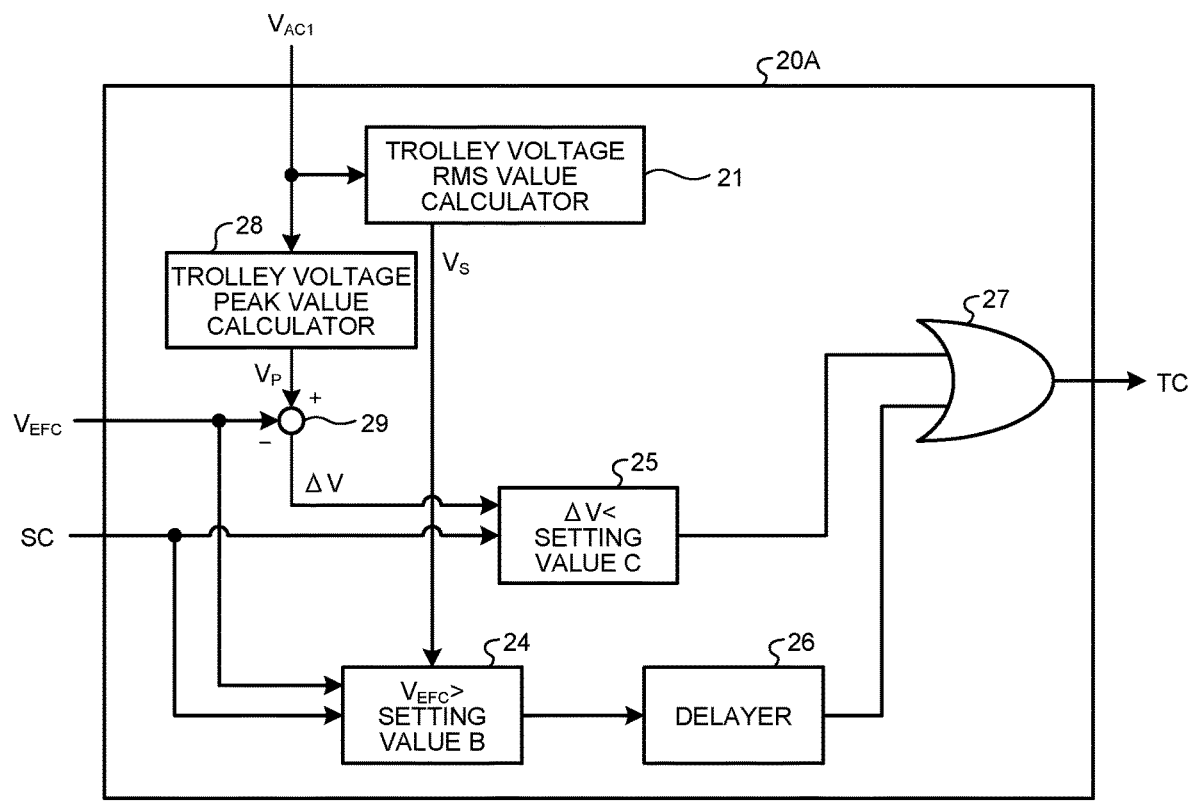
FIG. 9 is a block diagram illustrating a configuration of a computer in a second embodiment.

FIG. 9 is a block diagram illustrating a configuration of a computer 20A in a second embodiment. In the computer 20A illustrated in FIG. 9, the comparator 23 in the configuration of the computer 20 of the first embodiment illustrated in FIG. 2 has been replaced with a comparator 25. In addition, the computer 20A further includes a trolley voltage peak value calculator 28 and an adder-subtractor 29, which are added to the configuration of the computer 20 of the first embodiment illustrated in FIG. 2. The computer 20A is configured such that an output of the adder-subtractor 29 is input to the comparator 25. The other part of the configuration is identical or similar to the configuration of the first embodiment. Identical or similar configuration elements are designated by the same reference characters, and duplicate description will be omitted.

The trolley voltage peak value calculator 28 receives the trolley voltage instantaneous value $V_{AC1}$. The trolley voltage peak value calculator 28 calculates a trolley voltage peak value $V_P$, which is the peak value of the trolley voltage instantaneous value $V_{AC1}$, using the trolley voltage instantaneous value $V_{AC1}$. Note that the trolley voltage peak value calculator 28 may hold and output the peak value of the trolley voltage instantaneous value rather than directly calculating the trolley voltage peak value $V_P$.

The adder-subtractor 29 receives the trolley voltage peak value $V_P$ calculated by the trolley voltage peak value calculator 28 and the intermediate link voltage $V_{EFC}$ detected by the DCPT 10. The adder-subtractor 29 generates a potential difference $\Delta V$, which is the differential voltage between the trolley voltage peak value $V_P$ and the intermediate link voltage $V_{EFC}$.

The comparator 25 receives the potential difference $\Delta V$ generated by the adder-subtractor 29 and the start-up command SC. The comparator 25 compares the potential difference $\Delta V$ with a determination threshold, i.e., a setting value C. That is, the comparator 25 makes a comparison on magnitude relationship between the potential difference $\Delta V$ and the setting value C. The setting value C is, unlike the setting value A, a constant setting value independent of the trolley voltage. In a case in which the potential difference $\Delta V$ is less than the setting value C, the comparator 25 determines that the comparison result of the comparison unit 25 is significant, and outputs a logical "1" to the OR circuit 27. Otherwise, in a case in which the potential difference $\Delta V$ is greater than or equal to the setting value C, the comparator 25 determines that the comparison result of the comparator 25 is not significant, and outputs a logical "0" to the OR circuit 27.

Note that although the foregoing description describes that a logical "1" is output to the OR circuit 27 in a case in which the potential difference $\Delta V$ is less than the setting value C, a logical "1" may also be output to the OR circuit 27 in a case in which potential difference $\Delta V$ is equal to the setting value C. That is, a logical "1" may be output to the OR circuit 27 in a case in which the potential difference $\Delta V$ is less than or equal to the setting value C.

The OR circuit 27 receives the output of the comparator 25 and the output of the delayer 26. The functionality and the actions of the comparator 24 and of the delayer 26 are identical or similar to those of the first embodiment. In a case in which at least one of the output of the comparator 25 and the output of the delayer 26 is a logical "1", the OR circuit 27 outputs an initial charging completion signal TC indicating that the initial charging of the smoothing capacitor 9 is complete. The subsequent operation is identical or similar to the operation of the first embodiment.

Figure 10:
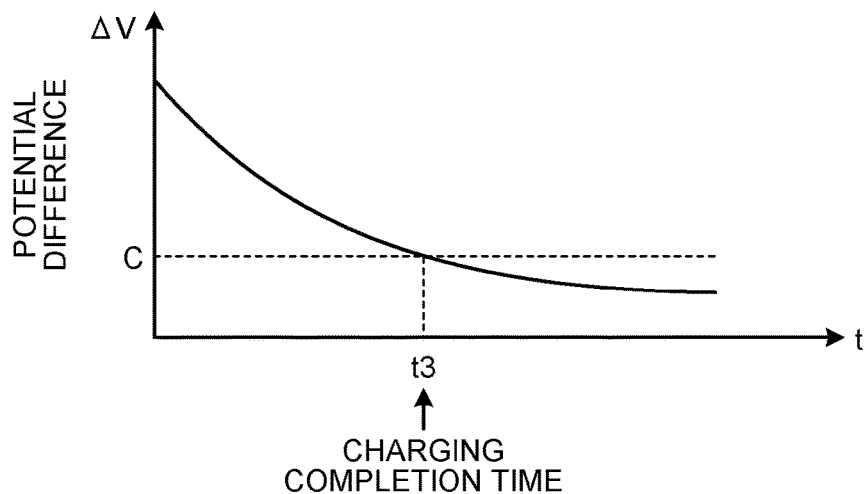
FIG. 10 is a diagram for describing operation of the computer in the second embodiment.

FIG. 10 is a diagram for describing operation of the computer 20A in the second embodiment. FIG. 10 illustrates the waveform of the potential difference $\Delta V$ output from the adder-subtractor 29. In addition, FIG. 10 illustrates a situation in which the potential difference $\Delta V$ reaches the setting value C at time t3.

As described above, when the waveform of the trolley voltage is distorted, the intermediate link voltage $V_{EFC}$ is reduced as compared to when the waveform of the trolley voltage is not distorted. This also applies to the trolley voltage peak value $V_P$. Therefore, when the waveform of the trolley voltage is distorted, the trolley voltage peak value $V_P$ is also reduced as compared to when the waveform of the trolley voltage is not distorted. Thus, there is likely to be a correlation between a variation in the intermediate link voltage $V_{EFC}$ and a variation in the trolley voltage peak value $V_P$. Accordingly, in the second embodiment, comparison of the potential difference $\Delta V$ between the trolley voltage peak value $V_P$ and the intermediate link voltage $V_{EFC}$ with the setting value C, which is a determination threshold, enables the intermediate link voltage $V_{EFC}$ to reliably reach the start-up voltage even when the waveform of the trolley voltage is distorted. This enables the AC electric rolling stock to quickly and reliably start up even when the waveform of the trolley voltage is distorted.

Note that the determination logic of the second embodiment to compare the potential difference $\Delta V$ between the trolley voltage peak value $V_P$ and the intermediate link voltage $V_{EFC}$ with the setting value C is more reliable then the determination logic of the first embodiment to make a comparison on magnitude relationship between the intermediate link voltage $V_{EFC}$ and the setting value A. As such, the comparator 24, the delayer 26, and the OR circuit 27 that are auxiliarily provided may be removed from the configuration of FIG. 9. In such configuration, initial charging of the smoothing capacitor 9 can be determined to be complete when the comparison result of the comparator 25 is significant.

Third Embodiment

Figure 11:
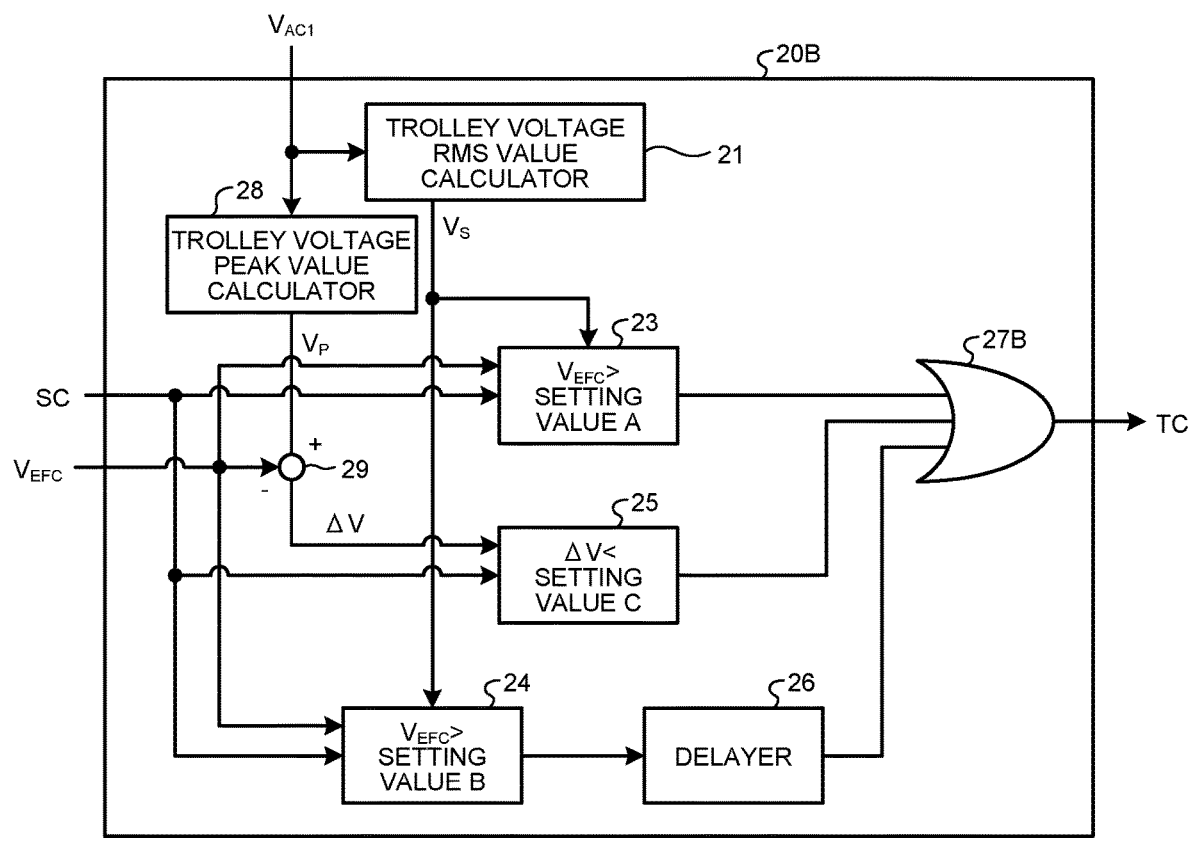
FIG. 11 is a block diagram illustrating a configuration of a computer in a third embodiment.

FIG. 11 is a block diagram illustrating a configuration of a computer 20B in a third embodiment. In the computer 20B illustrated in FIG. 11, the OR circuit 27 in the configuration of the computer 20A of the second embodiment illustrated in FIG. 9 has been replaced with an OR circuit 27B, and the comparator 23 in the computer 20 of the first embodiment illustrated in FIG. 2 has been added. That is, the computer 20B in the third embodiment is formed by combination of the computer 20 in the first embodiment illustrated in FIG. 2 and the computer 20A in the second embodiment illustrated in FIG. 9. Note that configuration elements identical or similar to the elements in the configurations of the first embodiment and of the second embodiment are designated by the same reference characters, and duplicate description will be omitted.

The OR circuit 27B receives the output of the comparator 23, the output of the comparator 25, and the output of the delayer 26. In a case in which at least one of the output of the comparator 23, the output of the comparator 25, and the output of the delayer 26 is a logical "1", the OR circuit 27B outputs an initial charging completion signal TC, which indicates completion of the initial charging of the smoothing capacitor 9. The subsequent operation is identical or similar to the operation of the first and second embodiments.

According to the third embodiment: the feature of the determination logic of the first embodiment to make a comparison on magnitude relationship between the intermediate link voltage $V_{EFC}$ and the setting value A; and the feature of the determination logic of the second embodiment to make a comparison on magnitude relationship between the potential difference $\Delta V$ between the trolley voltage peak value $V_P$ and the intermediate link voltage $V_{EFC}$ and the setting value C; are utilized complementarily to each other, and this enables a determination logic to be established that is insusceptible to distortion of the waveform of the trolley voltage. For example, the setting value A is chosen to cause the comparator 23 to output a logical "1" before the comparator 25 when the waveform of the trolley voltage is not significantly distorted. In addition, the setting value C is chosen to cause the comparator 25 to output a logical "1" before the comparator 23 when the waveform of the trolley voltage is distorted, for example, as illustrated in FIG. 4. Use of such setting value A and setting value C enables a determination logic to be established that is not significantly affected by distortion of the waveform of the trolley voltage.

Figure 12:
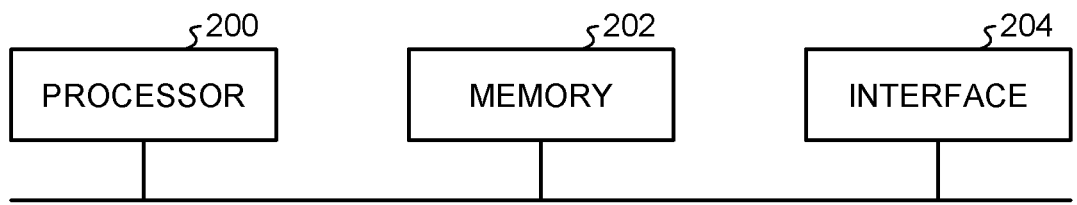
FIG. 12 is a block diagram illustrating an example of hardware configuration of each of the computers of the first through third embodiments.
Figure 13:
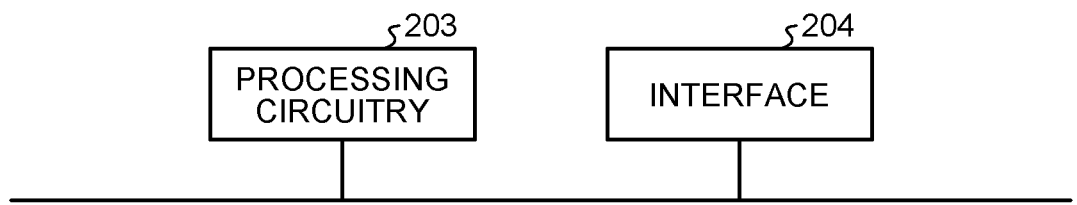
FIG. 13 is a block diagram illustrating another example of hardware configuration of each of the computers of the first through third embodiments.

A hardware configuration for implementing each of the computers in the first through third embodiments will be described with reference to the drawings of FIGS. 12 and 13. FIG. 12 is a block diagram illustrating an example of hardware configuration of each of the computers of the first through third embodiments. FIG. 13 is a block diagram illustrating another example of hardware configuration of each of the computers of the first through third embodiments.

To implement the functionality of each of the computers in the first through third embodiments, a configuration may be used, as illustrated in FIG. 12, that includes a processor 200 that performs computation, a memory 202 that stores a program to be read by the processor 200, and an interface 204 that inputs and outputs signals.

The processor 200 may be computing means such as a computer, a microprocessor, a microcomputer, a central processing unit (CPU), or a digital signal processor (DSP). In addition, examples of the memory 202 include a non-volatile or volatile semiconductor memory such as a random access memory (RAM), a read-only memory (ROM), a flash memory, an erasable programmable ROM (EPROM), or an electrically EPROM (EEPROM) (registered trademark); a magnetic disk, a flexible disk, an optical disk, a compact disc, a MiniDisc, a digital versatile disc (DVD), and a Blu-ray (registered trademark) disk (BD).

The memory 202 stores a program for performing the functionality of each one of the computers and a table referred to by the processor 200. The processor 200 provides and receives necessary information via the interface 204. The processor 200 executes a program stored in the memory 202, and the processor 200 refers to the table stored in the memory 202. The computing processing described above can thus be performed. The result of computation by the processor 200 may be stored in the memory 202.

In addition, the processor 200 and the memory 202 illustrated in FIG. 12 may be replaced with a processing circuitry 203 as illustrated in FIG. 13. The processing circuitry 203 is a single circuit, a set of multiple circuits, an application specific integrated circuit (ASIC), a field-programmable gate array (FPGA), or a combination thereof.

Note that the configurations described in the foregoing embodiments are merely examples of various aspects of the present invention. These configurations may be combined with a known other technology, and moreover, a part of such configurations may be omitted and/or modified without departing from the spirit of the present invention.

REFERENCE SIGNS LIST 1 pantograph; 2 circuit breaker; 3 main transformer; 3a primary winding; 3b secondary winding; 4 charging resistor; 5 charging contactor; 6 main contactor; 8 converter; 9 smoothing capacitor; 10 DC voltage detector; 11 inverter; 12 controller; 14 AC voltage detector; 16 motor; 20, 20A, 20B computer; 21 trolley voltage RMS value calculator; 23, 24, 25 comparator; 26 delayer; 27, 27B OR circuit; 28 trolley voltage peak value calculator; 29 adder-subtractor; 40 DC power supply; 42 equivalent resistance; 50 controller; 100 drive system; 101 AC trolley; 200 processor; 202 memory; 203 processing circuitry; 204 interface.

The invention claimed is:

1. An alternating current (AC) electric rolling stock controller disposed in an AC electric rolling stock including a converter to convert an AC voltage from an AC trolley into a direct current (DC) voltage, and a smoothing capacitor to smooth the DC voltage output by the converter to control initial charging of the smoothing capacitor, the AC electric rolling stock controller comprising:
  a first comparator to compare an intermediate link voltage being a voltage generated at the smoothing capacitor, with a first threshold;
  a second comparator to compare the intermediate link voltage with a second threshold less than the first threshold; and
  a delayer to delay an output of the second comparator, wherein
  it is determined that the initial charging of the smoothing capacitor is complete in a case in which at least one of an output of the first comparator and an output of the delayer is significant.

2. The AC electric rolling stock controller according to claim 1, comprising:
  a root mean square value calculator to calculate a root mean square value of a trolley voltage output from the AC trolley, wherein
  the first threshold and the second threshold are set based on the root mean square value calculated of the trolley voltage.

3. An alternating current (AC) electric rolling stock controller disposed in an AC electric rolling stock including a converter to convert, into a direct current (DC) voltage, an AC voltage output from an AC trolley and applied via a main transformer, and a smoothing capacitor to smooth the DC voltage output by the converter to control initial charging of the smoothing capacitor, the AC electric rolling stock controller comprising:
  a peak value calculator to calculate a peak value of a trolley voltage output from the AC trolley; and
  a first comparator to compare a differential voltage between the peak value calculated of the trolley voltage and an intermediate link voltage being a voltage generated at the smoothing capacitor, with a first threshold, wherein
  during the initial charging of the smoothing capacitor, the converter is caused to operate as a diode converter that provides rectification without performing switching operation, and
  it is determined that the initial charging of the smoothing capacitor is complete in a case in which an output of the first comparator is significant.

4. The AC electric rolling stock controller according to claim 3, wherein the first threshold is a constant setting value independent of the trolley voltage.

5. The AC electric rolling stock controller according to claim 3, comprising:
  a second comparator to compare the intermediate link voltage with a second threshold; and
  a delayer to delay output of the second comparator, wherein
  it is determined that the initial charging of the smoothing capacitor is complete in a case in which at least one of an output of the first comparator and an output of the delayer is significant.

6. An alternating current (AC) electric rolling stock controller disposed in an AC electric rolling stock including a converter to convert, into a direct current (DC) voltage, an AC voltage output from an AC trolley and applied via a main transformer, and a smoothing capacitor to smooth the DC voltage output by the converter to control initial charging of the smoothing capacitor, the AC electric rolling stock controller comprising:
  a first comparator to compare an intermediate link voltage being a voltage generated at the smoothing capacitor, with a first threshold;
  a second comparator to compare the intermediate link voltage with a second threshold less than the first threshold;
  a delayer to delay an output of the second comparator;

a peak value calculator to calculate a peak value of a trolley voltage output from the AC trolley; and a third comparator to compare a differential voltage between the peak value calculated of the trolley voltage and the intermediate link voltage being the voltage generated at the smoothing capacitor, with a third threshold, wherein it is determined that the initial charging of the smoothing capacitor is complete in a case in which at least one of an output of the first comparator, an output of the delayer, and an output of the third comparator is significant.

7. The AC electric rolling stock controller according to claim 4, comprising:

a second comparator to compare the intermediate link voltage with a second threshold; and a delayer to delay output of the second comparator, wherein it is determined that the initial charging of the smoothing capacitor is complete in a case in which at least one of an output of the first comparator and an output of the delayer is significant.

\* \* \* \* \*